(12) United States Patent
Kamashita et al.

(10) Patent No.: US 7,186,595 B2
(45) Date of Patent: Mar. 6, 2007

(54) SOLID PICTURE ELEMENT MANUFACTURING METHOD

(75) Inventors: Atsushi Kamashita, Kawasaki (JP); Satoshi Suzuki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 44 days.

(21) Appl. No.: 09/925,905

(22) Filed: Aug. 9, 2001

(65) Prior Publication Data

US 2001/0054724 A1 Dec. 27, 2001

Related U.S. Application Data

(62) Division of application No. 09/177,254, filed on Oct. 22, 1998, now Pat. No. 6,281,531.

(30) Foreign Application Priority Data

Oct. 23, 1997 (JP) ............................................ 09-309638

(51) Int. Cl.
*H01L 21/339* (2006.01)

(52) U.S. Cl. ........................... 438/144; 438/145; 438/60

(58) Field of Classification Search ................. 438/144, 438/60, 75, FOR. 213, 76, 77, 78, 79, 145, 438/146, 147, 148
See application file for complete search history.

(56) References Cited

U.S. PATENT DOCUMENTS

| | | | | |
|---|---|---|---|---|
| 5,276,341 A | * | 1/1994 | Lee | ............................ 257/223 |
| 5,476,808 A | * | 12/1995 | Kusaka et al. | ................. 438/75 |
| 5,563,429 A | | 10/1996 | Isogai | |
| 5,567,632 A | * | 10/1996 | Nakashiba et al. | ............ 438/78 |
| 5,637,893 A | * | 6/1997 | Furumiya | ..................... 257/222 |
| 5,641,700 A | * | 6/1997 | Hawkins et al. | ............. 257/246 |
| 5,734,293 A | * | 3/1998 | Gross | ........................... 327/561 |
| 5,858,812 A | * | 1/1999 | Furumiya | ..................... 438/76 |
| 5,872,371 A | | 2/1999 | Guidash et al. | |
| 5,903,021 A | | 5/1999 | Lee et al. | |
| 5,904,493 A | | 5/1999 | Lee et al. | |
| 5,942,774 A | | 8/1999 | Isogai et al. | |
| 5,949,061 A | | 9/1999 | Guidash et al. | |
| 6,127,697 A | | 10/2000 | Guidash | |

FOREIGN PATENT DOCUMENTS

JP        03171676 A   *   7/1991

* cited by examiner

*Primary Examiner*—Tom Thomas
*Assistant Examiner*—N. Drew Richards
(74) *Attorney, Agent, or Firm*—Ipsolon LLP

(57) ABSTRACT

A solid picture element that transfers charges completely from a photodiode portion to an amplifying transistor portion to substantially eliminate residual images and methods of its manufacture are disclosed. The solid picture element includes a buried photodiode and a transistor in communication with a transfer gate that is a selective transfer path for charges from the photodiode to the transistor. The charge accumulation region is located so that it is not in contact with the upper surface of the semiconductor substrate and so that a margin of the charge accumulation region is located 0.0 to 0.2 μm closer to the transistor than any portion of the depletion prevention region. Methods of manufacture of the picture element of the present invention include using the transfer gate as a mask and implanting ions into a semiconductor substrate at a first angle to form the charge accumulation region and at a second, steeper, angle to form the depletion prevention region. Alternative methods of manufacture include sifting a portion of a mask to sift end margins of the charge accumulation region and the depletion prevention region to achieve the desired geometry.

7 Claims, 12 Drawing Sheets

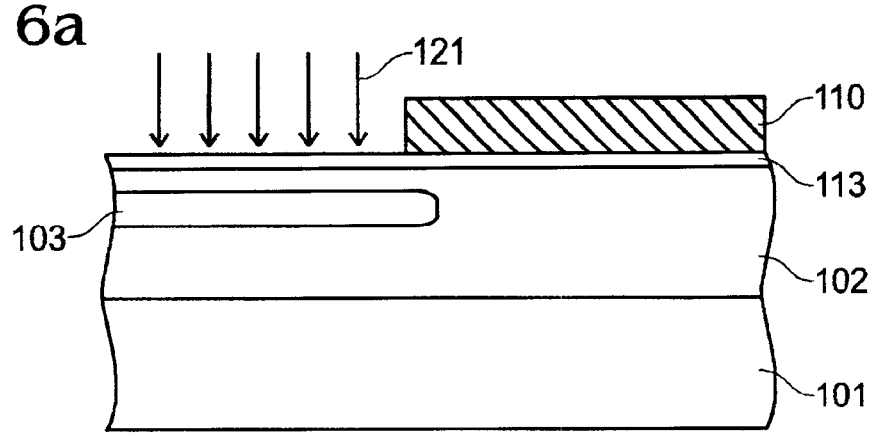
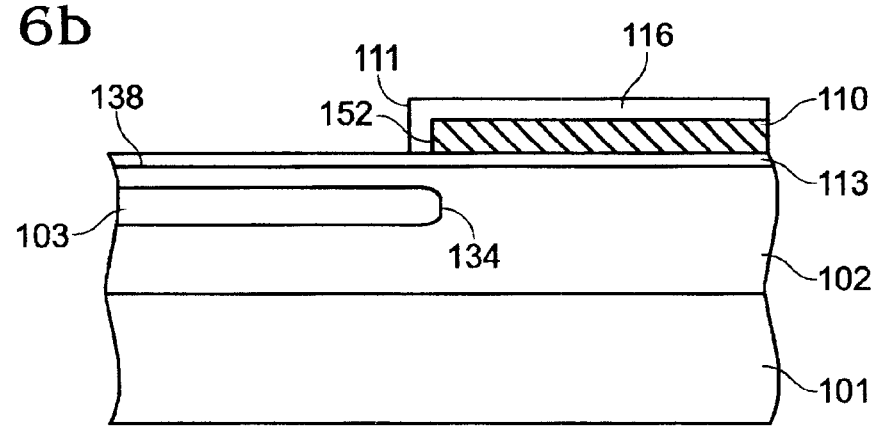
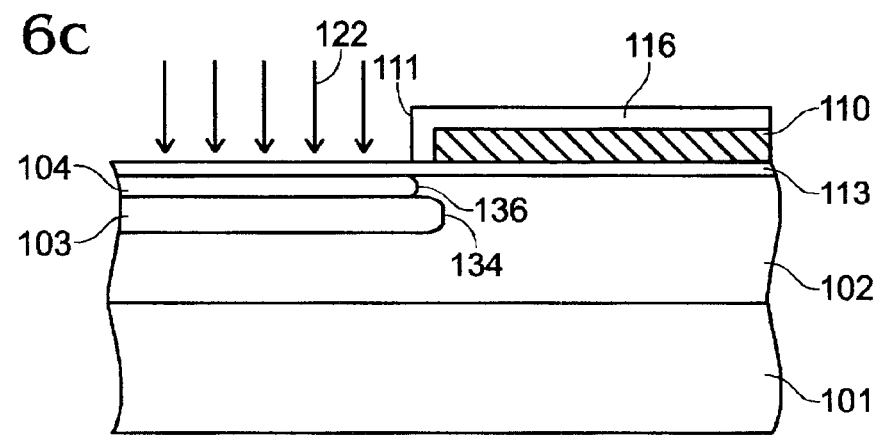

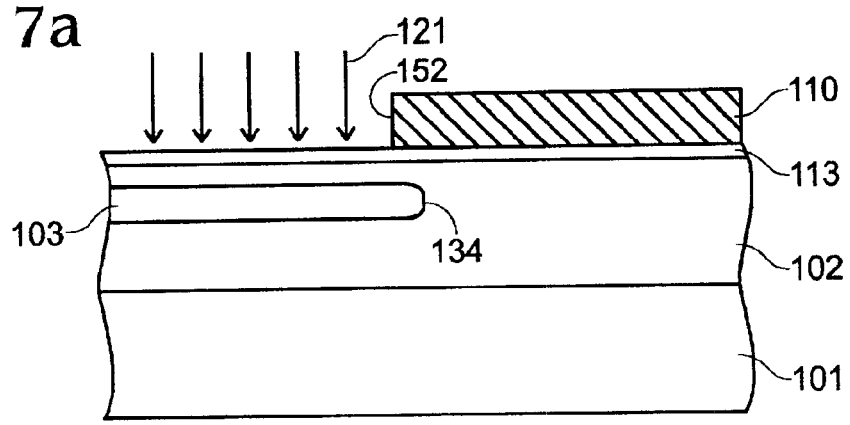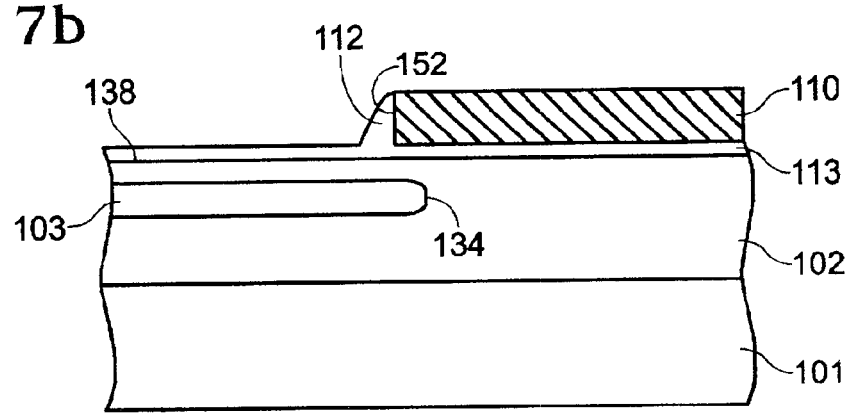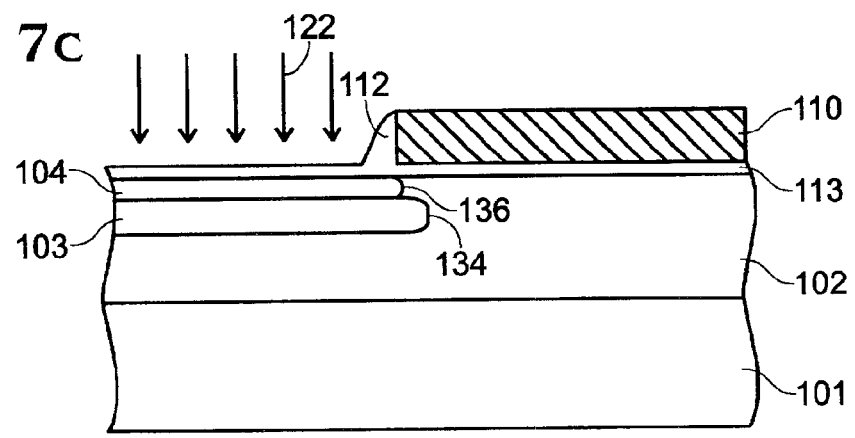

Fig. 13 - Prior Art
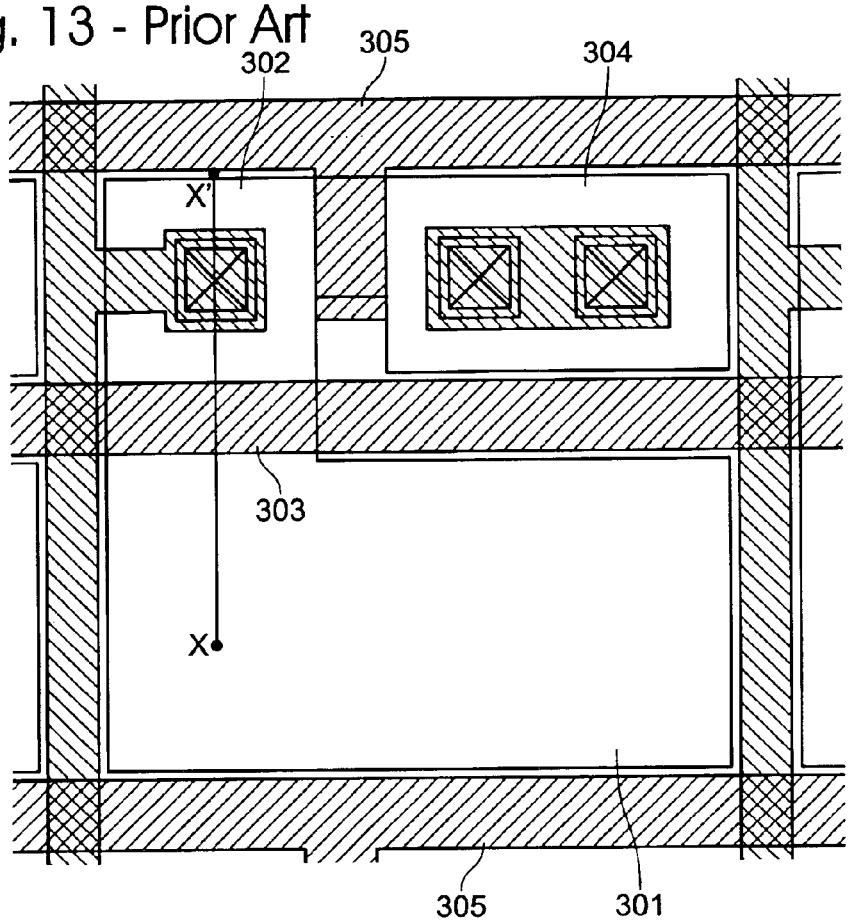
Fig. 16 - Prior Art
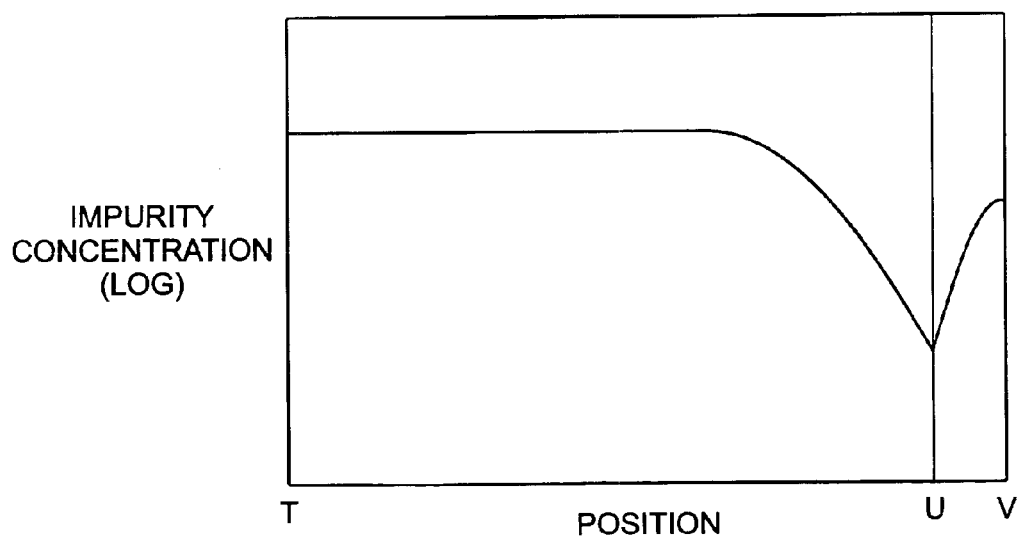

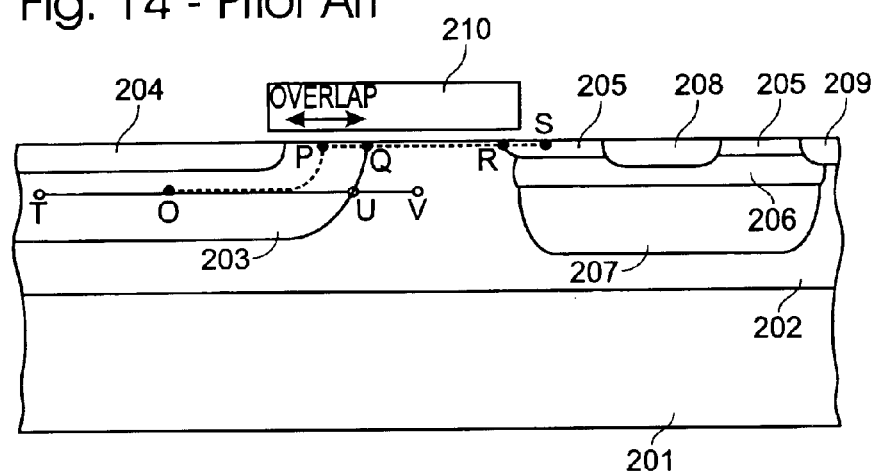
Fig. 14 - Prior Art
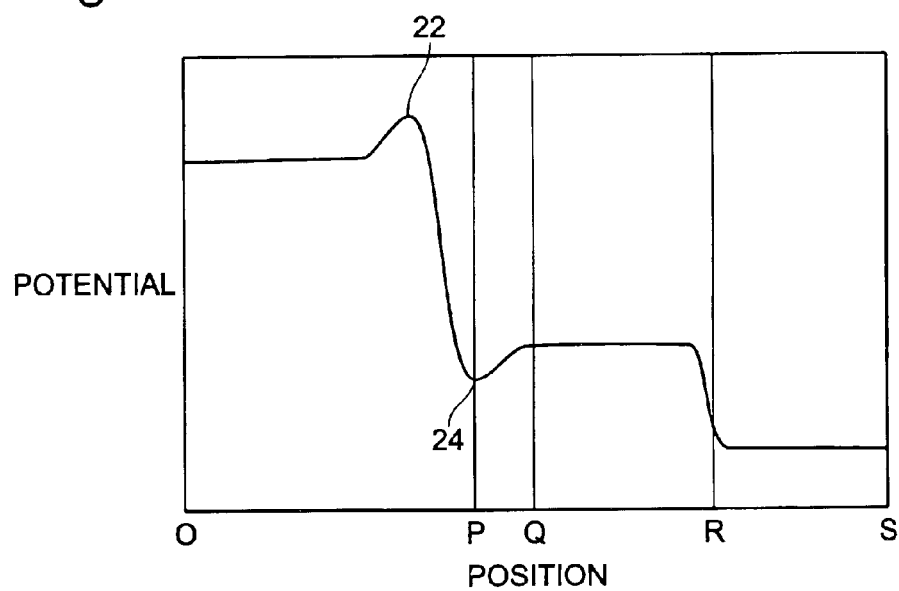
Fig. 15 - Prior Art

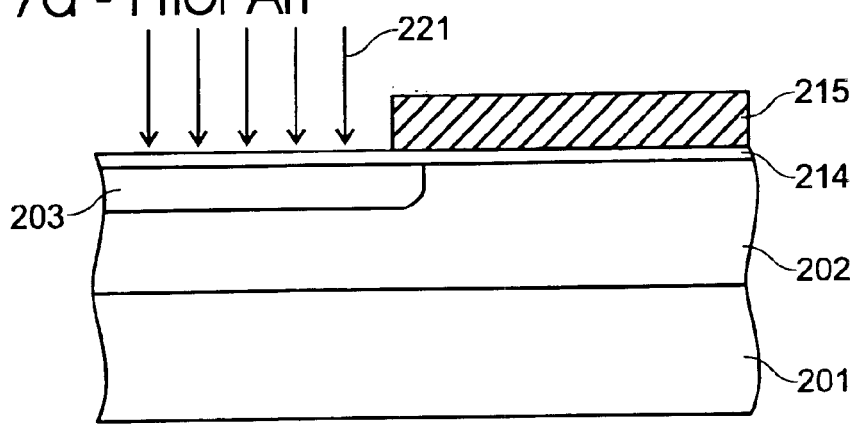
Fig. 17a - Prior Art
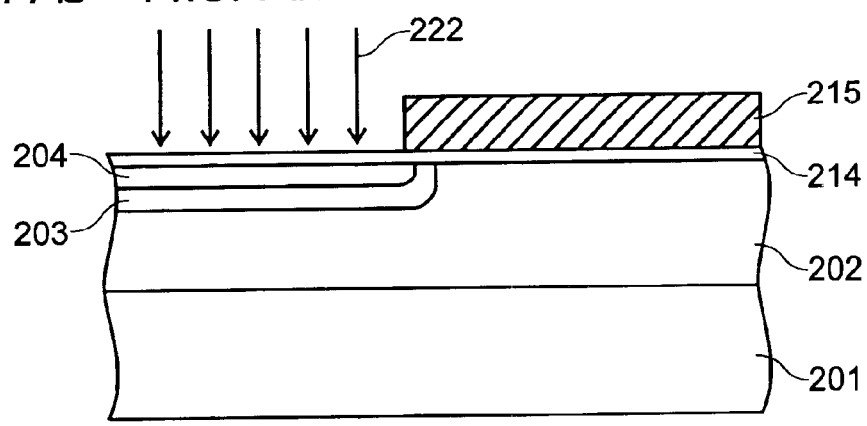
Fig. 17b - Prior Art
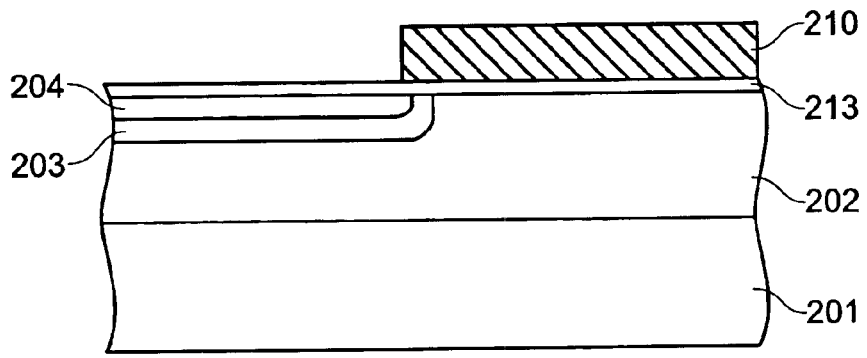
Fig. 17c - Prior Art

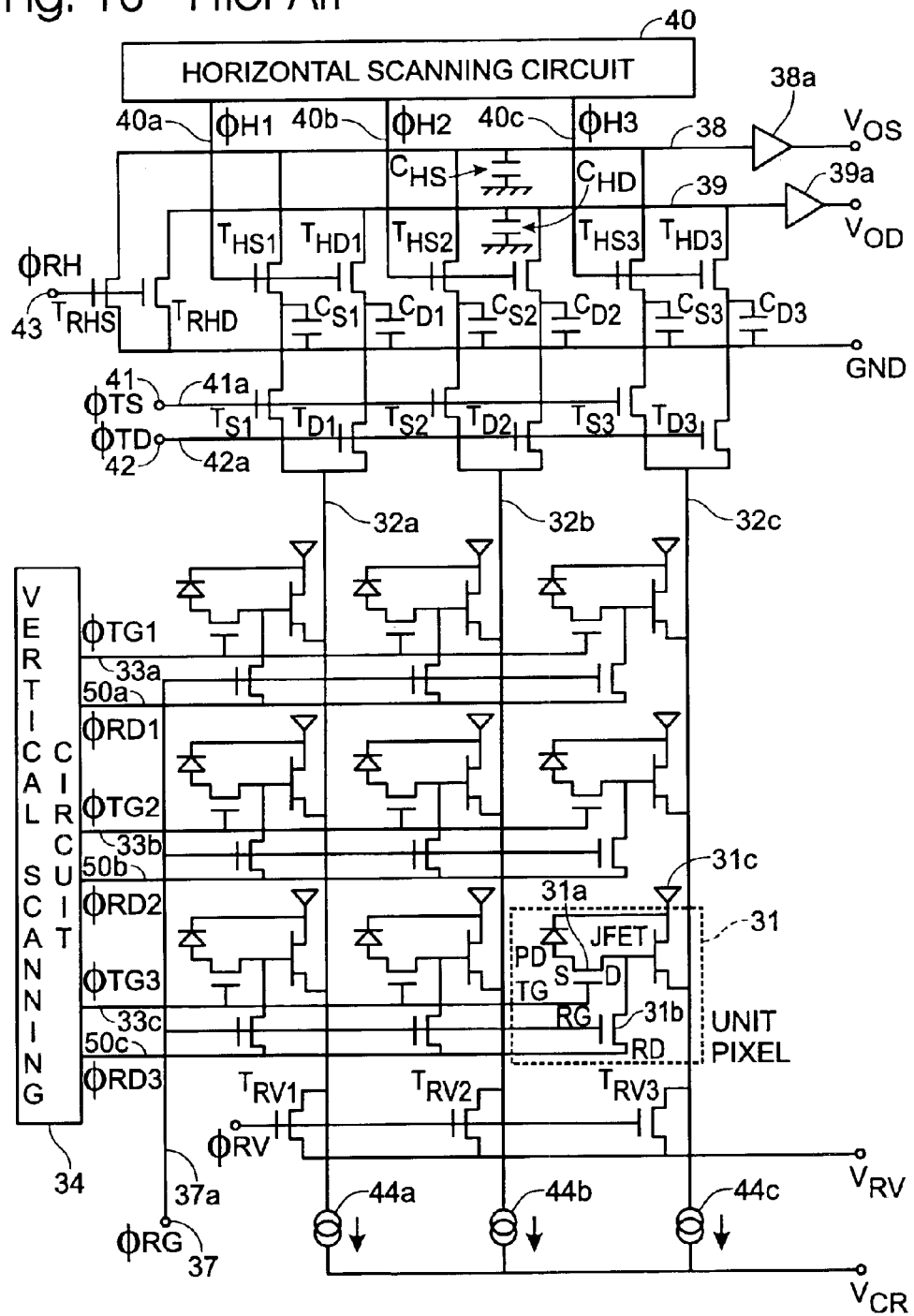
Fig. 18 - Prior Art

SOLID PICTURE ELEMENT MANUFACTURING METHOD

This is a divisional of application Ser. No. 09/177,254, filed Oct. 22, 1998 U.S. Pat. No. 6,281,531.

FIELD OF THE INVENTION

This invention pertains to a solid picture element and methods of manufacture of the solid picture element. More particularly, this invention pertains to the structure of a light receiving part of the solid picture element and its methods of manufacture.

BACKGROUND AND SUMMARY OF THE INVENTION

A solid-state image sensing device, such as a charge-coupled device, responds to incident light to generate signal charges that are stored in a depletion region and produce an output signal at an output terminal thereof. A basic charge-coupled device includes a metal-oxide semiconductor device in which a metal electrode is positioned on, and insulated from, a silicon substrate. Charge-coupled devices, or solid picture elements, are arranged in arrays and coupled to circuitry that samples the devices for use in, for example, generating a video image.

In recent years, to increase the sensitivity of picture elements, several types of elements known as amplifier type picture elements have been disclosed in which a transistor for amplifying signals is installed. An example of this is disclosed by Japanese unexamined patent application no. 8-293591. The elements disclosed by this patent application are several examples in which a charge accumulation portion that accumulates charges produced in response to light incident on a light receiving part and an amplifying transistor that outputs signals in response to charges detected are formed in separate locations, and a transfer gate is installed between these to control the transfer of charges from the charge accumulation portion to the amplifying transistor. Of these, examples are disclosed in which the photodiode of the light receiving part is a buried photodiode (BPD), and in which the amplifying transistor is a junction field effect transistor (JFET).

FIG. 13 shows a schematic plan of a unit pixel of a prior art solid picture element. In addition, FIG. 18 shows an example of an overall circuit structure of a solid picture element.

The prior art solid picture element, shown in FIG. 13, is comprised of parts that include BPD 301 that is a light receiving part or photoelectric converter part, JFET 302 that amplifies the photoelectrically converted charge, transfer gate 303 that controls transfer of charges from BPD 301 to JFET 302, reset drain 304 that applies a reset potential to the JFET gate, and reset gate 305 that controls the JFET reset operation.

FIG. 14 is a cross section of the solid picture element shown in FIG. 13 taken along line X–X'.

As shown in FIG. 14, N-type well 202 is formed in P-type substrate 201. Formed in this N-type well 202 are BPD P-type charge accumulation layer 203 and N-type depletion prevention layer 204, P-type gate 205 used as the JFET gate on the substrate surface, N-type channel 206 used as the JFET channel, deep P-type gate 207 used as the JFET gate below the channel, N-type source 208 used as the JFET source, and N-type drain 209 used as the JFET drain and as an element separator.

Because normally each of these regions is formed by implanting ions selectively into the surface of semiconductor substrate 201, then heating and diffusing the substrate, the impurity concentration becomes lower the deeper the layer is in the semiconductor substrate, and the impurity concentration also is reduced gradually by horizontal diffusion in the region close to the edge of masks during ion implantation. Transfer gate 210, which is an electrode that controls transfer of charges on the surface of substrate 201 from the BPD to the JFET, is installed on an insulating film (not shown in the figure), such as silicon oxide film. In addition, connecting parts (not shown) connect P-type gate 205 to deep P-type gate 207, and N-type well 202 to N-type depletion prevention layer 204 to maintain gate 205 and deep gate 207, and well 202 and layer 204, at the same potential. Furthermore, FIG. 14 does not show an aluminum, or similar, pattern that is connected to JFET N-type source 208.

Generally, prior art solid picture elements or the type of FIG. 14 are fabricated by a method such as shown schematically in FIGS. 17a–17c. FIGS. 17a–17c do not show regions corresponding to JFET 302, reset drain 304, and rest gate 305 in FIG. 14.

With reference to FIGS. 17a–17c, N-type well 202 is formed in P-type semiconductor substrate 201, and a protective oxide film 214, a relatively thin insulating film, is formed on the surface of substrate 201 either before or after forming N-type well 202. Resist mask 215 is formed on the protective oxide film 214 on the surface of substrate 201. By implanting P-type ions 221 near the surface of substrate 201, and using resist mask 215 as a mask, then heating and diffusing the substrate, BPD P-type charge accumulation layer 203 is formed in N-type well 202 (FIG. 17(a)).

By implanting N-type ions 222 near the surface of substrate 201 using the same resist mask 215 as a mask, then heating and diffusing the substrate, N-type depletion prevention layer 204 is formed in P-type charge accumulation layer 203 (FIG. 17(b)). P-type charge accumulation layer 203 and N-type depletion prevention layer 204 also can be formed by heat diffusion by implanting P-type ions 221 and implanting N-type ions 222, then performing heat treatment all at once.

Resist mask 215 is then removed, gate oxide film 213 is formed on the surface of substrate 201 (e.g., by making the thickness of protective oxide film 214 thicker) and transfer gate 210 is formed of a material such as polysilicon on gate oxide film 213 (FIG. 17(c)).

P-type charge accumulation layer 203 and N-type depletion prevention layer 204 also can be formed by implanting P-type ions or N-type ions without using resist mask 215 by using at least part of transfer gate 210 as a mask. But, in either case, the edge of the mask when used to implant ions to form P-type charge accumulation layer 203 is either in the same position as, or closer to, the JFET than the edge of the mask when used to implant ions to form N-type depletion prevention layer 204.

Next, the prior art charge transfer operation, from P-type charge accumulation layer 203 to the JFET in this type of solid picture element, is explained.

As an example, substrate potential is set to 0 V and N-type well 202 and N-type depletion prevention layer 204 are set to 5 V. When a charge has accumulated on the BPD, transfer gate 210 is set to 5 V and placed in OFF state. In addition, by setting reset gate 305 to an ON state by applying a voltage and setting reset drain 304 to −5 V, the JFET P-type gate becomes the same −5 V as the potential of reset drain 304, and the JFET is placed in an OFF state. Because the part of P-type charge accumulation layer 203 that contacts the surface of semiconductor substrate 201 is inverted to N-type at this time, the speed of generation of noise current in this part is slow. Charge accumulates in BPD P-type charge accumulation layer 203 and the potential of P-type charge accumulation layer 203 rises, and when this reaches a certain level of potential or higher, the charge overflows into the substrate.

When a charge is transferred from the BPD to the JFET, first, by placing reset gate 305 in an ON state and setting reset drain 304 to −2 V, the JFET P-type gate 205 is set to −2 V. Next, by placing reset gate 305 in an OFF state, the JFET P-type gate 205 becomes floating. Next, transfer gate 210 is set to −2 V and placed in ON state, and the charge is transferred from BPD P-type charge accumulation layer 203 to JFET P-type gate 205.

As charges are transferred to P-type gate 205 and deep P-type gate 207, the potential of P-type charge accumulation layer 203 drops and the potential of JFET P-type gate 205 and deep P-type gate 207 rises. When the potential of JFET N-type source 208 is set, for example, to approximately 0 V by a read circuit (not shown in the figure) and the potential of JFET P-type gate 205 exceeds approximately 0 V, the PN junction reverses direction and the charge is expelled to JFET N-type source 208. As a result, the potential of JFET P-type gate 205 rises only to a peak of approximately 0 V. Therefore, when P-type charge accumulation layer 203 is set to a depletion voltage of approximately 5 V or less, P-type charge accumulation layer 203 can be depleted by this type of charge transfer operation.

FIG. 15 shows the distribution of potential along charge transfer route OPQRS from BPD P-type charge accumulation layer 203 to JFET P-type gate 205 during charge transfer in FIG. 14. In addition, FIG. 16 shows the distribution of impurity concentration in the horizontal direction across positions T, U, and V in FIG. 14.

When P-type charge accumulation layer 203 is formed by heating and diffusing P-type ions implanted close to the surface of substrate 201, the impurity distribution near the edge of P-type charge accumulation layer 203 (corresponding to position U) becomes uneven and decreases gradually as shown in FIG. 16 from position T to position U. As a result, potential near this edge rises and produces a spike 22 in potential as shown by the curve from O to P in FIG. 15. In addition, in the region below transfer gate 210, because potential drops in the P-type part and rises in the N-type part as shown by P to R in FIG. 15, this produces a trough 24 in potential near point P on the charge transfer route.

When the size of the overlap shown in FIG. 14 is reduced—that is, when the distance on the surface of N-type well 202 from the edge of N-type depletion prevention layer 204, that faces the JFET to the edge of P-type charge accumulation layer 203 that faces the JFET is reduced, this trough 24 in potential is reduced, but the spike 22 in potential is increased. Conversely, when the overlap shown in FIG. 14 is increased, the spike in potential is reduced, but the trough in potential is increased. As a result, this type of trough and spike in potential cannot be eliminated simultaneously simply by controlling the size of overlap. Because this type of trough and spike in potential could not be completely eliminated, prior art solid picture elements have the problem that they are unable to transfer charges completely from the BPD to the JFET. This causes residual images.

In addition, in prior art fabrication of solid picture elements, P-type charge accumulation layer 203 and N-type depletion prevention layer 204 are formed by implanting ions using the same mask, then controlling heat treatment. However, this is a problem because the impurity ions that form P-type charge accumulation layer 203 and N-type depletion prevention layer 204 have different diffusion coefficients. Thus, the amount of horizontal diffusion differs for each type of ion, or is difficult to control, and it is difficult to control the size of overlap precisely.

In addition, when an overlap is formed by the difference in amount of horizontal diffusion caused by the difference in diffusion coefficients, forming an overlap of about 0.4 micrometers, for example, requires excessive heat treatment and is imprecise. This excessive heat treatment affects other diffusion layers or causes wafer warping, and furthermore risks causing discrepancies in element characteristics.

A preferred embodiment of the present invention solves the problems of prior art devices by providing a solid picture element having a semiconductor substrate region (a well formed in a semiconductor substrate) of a first conductive type, a charge accumulation region of a second conductive type installed within the semiconductor substrate region, a depletion prevention region of the first conductive type installed in between the charge accumulation region and the surface of the semiconductor substrate region, a transistor for amplifying charges that is installed in a region within the semiconductor substrate region proximate the charge accumulation region and depletion prevention region, and a transfer gate, located on the surface of the semiconductor substrate region between the region where the depletion prevention region is installed and the region where the transistor is installed, that controls transfer of charges from the charge accumulation region to the transistor region.

The solid picture element is constructed such that an edge of the charge accumulation region that is closest to the transistor is located below the transfer gate, and an edge of the depletion prevention region that is closest to the transistor is located inline or further from the transistor than the charge accumulation region and the charge accumulation region does not contact the surface of the semiconductor substrate region. By this type of structure, charges can be transferred from the charge accumulation region of the photodiode to the amplifying transistor in a solid picture element, and residual images can be substantially eliminated.

In a preferred embodiment, the transfer gate is a metal-oxide semiconductor (MOS) gate.

In a preferred embodiment, the transistor can be a junction field effect transistor (JFET). Alternatively, the transistor can be constructed as a bipolar transistor. Or, alternatively, the transistor can be constructed as a MOS transistor. Either preferred embodiment makes it possible to increase the sensitivity of the solid picture element accurately.

Preferably, this solid picture element is constructed such that the edge of the charge accumulation region nearest the transistor is 0.0 to 0.2 μm closer to the transistor than the edge of the depletion prevention region that is nearest to the transistor. Because there is no trough or spike in potential in the charge transfer route from the charge accumulation region to the transistor during charge transfer in the present invention, it is possible to transfer charges completely and accurately and to substantially eliminate residual images securely.

In addition, this invention offers a method of manufacture of a solid picture element that has a semiconductor substrate region (a well formed on a semiconductor substrate) of a first conductive type, a charge accumulation region of a second conductive type installed within the semiconductor substrate region, a depletion prevention region of the first conductive type installed between the charge accumulation region and an upper surface of the semiconductor substrate region, a transistor for amplifying charges installed in a region within the semiconductor substrate region that faces the charge accumulation region and depletion prevention region, and a transfer gate that is installed on the upper surface of the semiconductor substrate region between the region where the depletion prevention region is installed and the region where the transistor is installed and that controls transfer of charges from the charge accumulation region to the transistor region. A preferred method of manufacture of the solid picture element includes implanting ions of the second conductive type at an angle to the upper surface of the semiconductor substrate region using the transfer gate as a mask and to form the charge accumulation region such that it is within the semiconductor substrate region and does not contact a surface of the semiconductor substrate region, and a step to implant ions of the first conductive type at an angle to the semiconductor substrate region that is closer to perpendicular to the upper surface than the angle at which the ions of the second conductive type were implanted using the transfer gate as a mask and to form the depletion prevention region such that it is between the charge accumulation region and the upper surface of the semiconductor substrate region, and the edge of the charge accumulation region that faces the transistor is closer to the transistor than the edge of the depletion prevention region that faces the transistor. By this means, the charge accumulation region and the depletion prevention region can be formed to the desired profile with good control, and a solid picture element can be manufactured easily that can transfer charges completely from the charge accumulation region of the photodiode to the amplifying transistor and substantially eliminate residual images.

In addition, this invention provides an alternative embodiment of a method of manufacture of a solid picture of the present invention including the steps of implanting ions of the second conductive type into the semiconductor substrate region using the transfer gate as a mask and to form the charge accumulation region such that it is within the semiconductor substrate region and does not contact the surface of the semiconductor substrate region, and installing an insulating film to increase the footprint of the transfer gate on the upper surface and then implanting ions of the first conductive type into the semiconductor substrate region using the transfer gate covered by the insulating film as a mask to form the depletion prevention region such that it is between the charge accumulation region and the upper surface of the semiconductor substrate region such that the edge of the charge accumulation region that faces the transistor is closer to the transistor than the edge of the depletion prevention region that faces the transistor. By this means, the charge accumulation region and the depletion prevention region can be formed to the desired profile with good control, and a solid picture element can be manufactured easily that can transfer charges completely from the charge accumulation region of the photodiode to the amplifying transistor and substantially eliminate residual images.

In addition, this invention provides an alternative embodiment of a method of manufacture of a solid picture element of the present invention including the steps of implanting ions of the second conductive type into the semiconductor substrate region using the transfer gate as at least part of a mask and to form the charge accumulation region such that it is within the semiconductor substrate region and does not contact the upper surface of the semiconductor substrate region, forming insulating film on the semiconductor substrate region and transfer gate, etching the insulating film to form a side wall insulating film on the side walls of the transfer gate, and implanting ions of the first conductive type into the semiconductor substrate region using the side wall insulating film as a mask and as a result to form the depletion prevention region such that it is between the charge accumulation region and the surface of the semiconductor substrate region and whereby the edge of the charge accumulation region that faces the transistor is closer to the transistor than the edge of the depletion prevention region that faces the transistor. By this means, the charge accumulation region and the depletion prevention region can be formed to the desired profile with good control, and a solid picture element can be manufactured easily that can transfer charges completely from the charge accumulation region of the photodiode to the amplifying transistor and substantially eliminate residual images.

In addition, this invention provides another alternative embodiment of a method of manufacture of a solid picture element including the steps of forming a mask layer on the semiconductor substrate region, implanting ions of the second conductive type into the semiconductor substrate region using the mask layer as a mask and to form the charge accumulation region such that it is within the semiconductor substrate region and does not contact the upper surface of the semiconductor substrate region, removing the mask layer, forming the transfer gate on the semiconductor substrate region such that the position of the edge of the transfer gate on the side of the charge accumulation region is closer to the charge accumulation region than the position of the corresponding edge of the mask layer, and implanting ions of the first conductive type into the semiconductor substrate region using the transfer gate as at least part of a mask to form the depletion prevention region such that it is between the charge accumulation region and the upper surface of the semiconductor substrate region, and the edge of the charge accumulation region that faces the transistor is closer to the transistor than the edge of the depletion prevention region that faces the transistor. By this means, the charge accumulation region and the depletion prevention region can be formed to the desired profile with good control, and a solid picture element can be manufactured easily that can transfer charges completely from the charge accumulation region of the photodiode to the amplifying transistor and substantially eliminate residual images.

BRIEF DESCRIPTION OF THE FIGURES

FIGS. 6a–6c are schematic diagrams that show a second preferred method for forming the P-type charge accumulation layer and the N-type depletion prevention layer in the solid picture element of FIG. 1.

FIGS. 7a–7c are schematic diagrams that show a third preferred method for forming the P-type charge accumulation layer and the N-type depletion prevention layer in the solid picture element of FIG. 1.

FIG. 13 is a schematic plan of a unit pixel of a prior art solid picture element.

FIG. 14 is a schematic cross section of the prior art solid picture element of FIG. 13 taken along line X–X'.

FIG. 15 is a graph that shows the distribution of potential along charge transfer route OPQRS during charge transfer by the prior art solid picture element shown in FIG. 14.

FIG. 16 is a graph that shows the distribution of impurity concentration in the horizontal direction across positions T, U, and V of the prior art solid picture element shown in FIG. 14.

FIGS. 17a–17c are schematic diagrams that show a prior art method for forming the P-type charge accumulation layer and N-type depletion prevention layer of the prior art solid picture element shown in FIG. 14.

FIG. 18 is a diagram of the overall circuit structure of a solid picture element that uses the unit pixel shown in FIG. 13.

DETAILED DESCRIPTION OF THE PREFERRED EMBODIMENTS OF THE INVENTION

Figure 1:
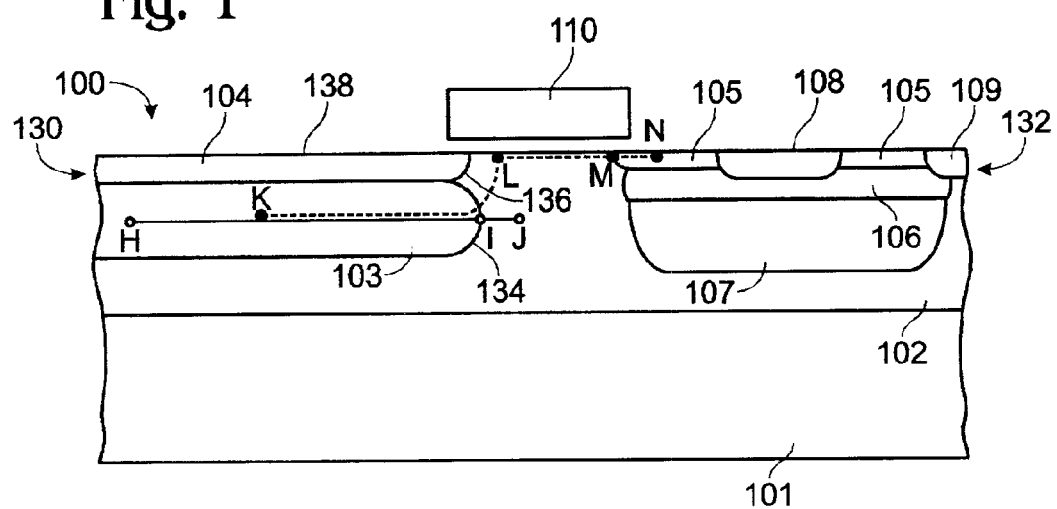
FIG. 1 is a schematic cross section of a first preferred embodiment of a solid picture element of the present invention that extends across a buried photodiode, transfer gate, and junction field-effect transistor (JFET) in the solid picture element.

With reference to the figures, a first preferred embodiment of a solid picture element of the present invention is explained. FIG. 1 is a cross section of a portion of a solid picture element 100 of the present invention showing a buried photodiode (BPD) 130 and transfer gate 110 to a JFET 132.

With particular reference to FIG. 1, a solid picture element 100 of this embodiment includes an N-type well 102 formed in a P-type semiconductor substrate 101. In the N-type well 102 are formed a BPD P-type charge accumulation layer 103, an N-type depletion prevention layer 104, a P-type gate 105 that is used as the JFET gate on the substrate surface, an N-type channel 106 that is used as the JFET channel, a deep P-type gate 107 that is used as the JFET gate below the channel, an N-type source 108 that is used as the JFET source, and an N-type drain 109 that is used as the JFET drain and to separate elements.

Preferably, N-type well 102 has an impurity concentration on the order of $7\times10^{15}$ cm$^{-3}$ and P-type semiconductor substrate 101 has an impurity concentration on the order of $5\times10^{14}$ cm$^{-3}$. Buried photodiode P-type charge accumulation layer 103 has an impurity concentration such as $3\times10^{16}$ cm$^{-3}$ and N-type depletion prevention layer 104 has an impurity concentration such as $3\times10^{17}$ cm$^{-3}$. P-type gate 105 has an impurity concentration such as $5\times10^{17}$ cm$^{-3}$, N-type channel 106 has an impurity concentration such as $5\times10^{16}$ cm$^{-3}$ and deep P-type gate 107 has an impurity concentration such as $5\times10^{17}$ cm$^{-3}$. N-type source 108 has an impurity concentration such as $5\times10^{20}$ cm$^{\times3}$ and N-type drain 109 has an impurity concentration of approximately $5\times10^{20}$ cm$^{-3}$.

Furthermore, between P-type charge accumulation layer 104 and JFET P-type gate 105 and on the surface of substrate 101, transfer gate 110 controls charge transfer from the BPD to the JFET and is installed by way of an insulating film such as silicon oxide film (not shown in the figure). Preferably, transfer gate 110 is comprised of polysilicon.

The solid picture element of this embodiment differs from the prior art solid picture element in that a margin 134 of P-type charge accumulation layer 103 that faces the JFET is formed such that it is inline with, or somewhat closer to, the JFET than (that is, it projects somewhat toward the JFET) a margin 136 of N-type depletion prevention layer 104 that faces the JFET. Further, the P-type accumulation layer margin 134 does not contact an upper surface 138 of substrate 101—that is, the surface of N-type well 102. In addition, P-type gate 105 and deep P-type gate 107 are connected by parts (not shown in the figure) and made the same in potential. Likewise, N-type well 102 and N-type depletion prevention layer 104 are connected by parts (not shown in the figure) and made the same in potential. Furthermore, FIG. 1 does not show an aluminum, or similar pattern, that is connected to JFET N-type source 108.

Figure 2:
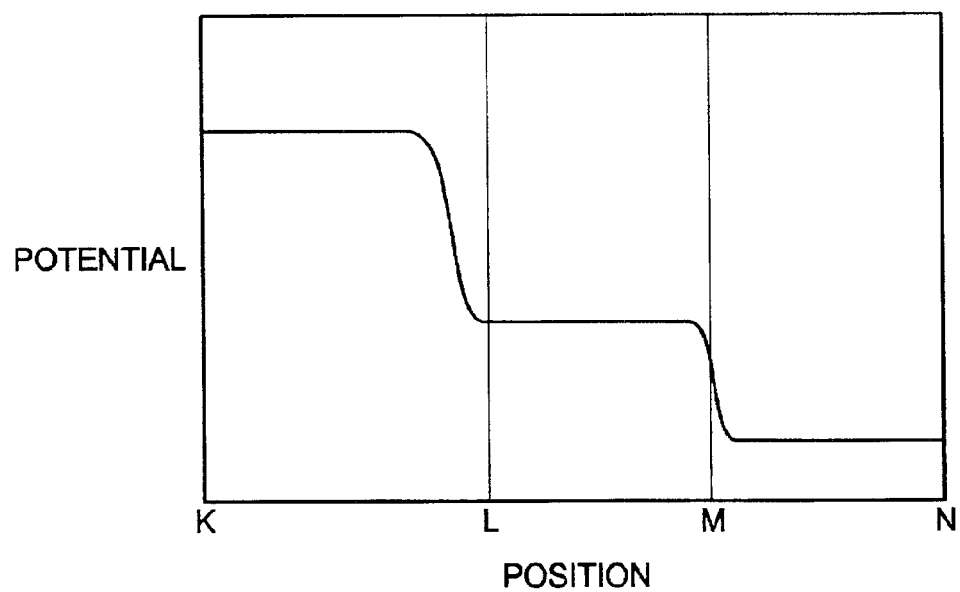
FIG. 2 is a graph of a distribution of potential along charge transfer route KLMN in the solid picture element of FIG. 1 during charge transfer.
Figure 3:
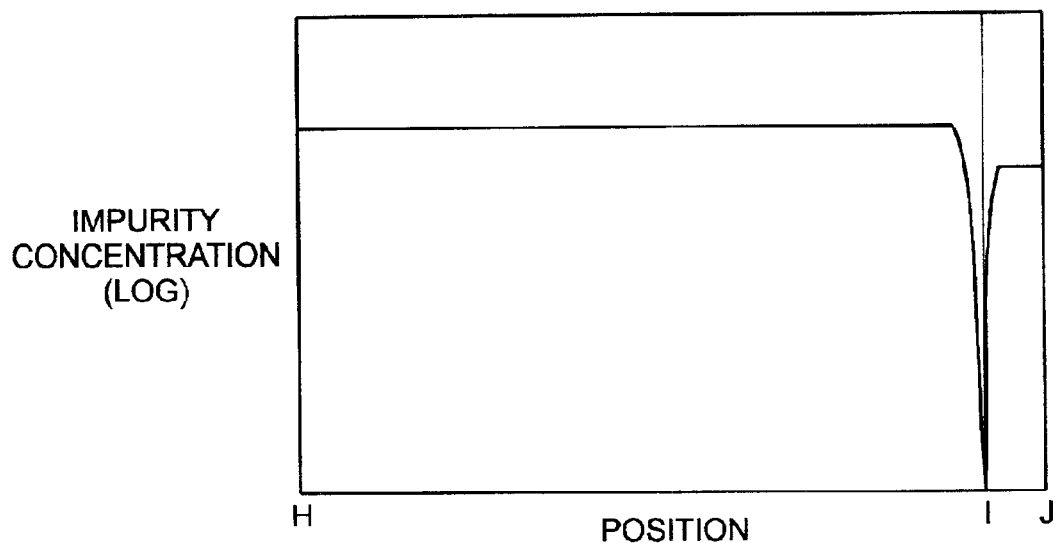
FIG. 3 is a graph of a distribution of impurity concentration in the horizontal direction across positions H, I, and J in the solid picture element of FIG. 1.

FIG. 2 is a graph that shows the distribution of potential along charge transfer route KLMN in FIG. 1 during charge transfer. FIG. 3 is a graph that shows the distribution of impurity concentration in the horizontal direction across positions H, I, and J in FIG. 1.

In the solid picture element of this embodiment, transfer gate 110 is placed in an ON state by applying a negative bias, and even if a charge is transferred from P-type charge accumulation layer 103 to JFET P-type gate 105. Because the margin 134 of P-type charge accumulation layer 103 that faces the JFET does not contact the upper surface 138 of semiconductor substrate 101 no trough in potential is formed along the charge transfer route on the surface of the semiconductor substrate below transfer gate 110.

In addition, within P-type charge accumulation layer 103 (ref. points H and I), as shown in FIG. 3, the distribution of impurity concentration is more or less constant except for the region extremely close to the edge of P-type charge accumulation layer 103 at position I. P-type charge accumulation layer 103 that has this type of distribution of impurity concentration can be formed by methods such as the methods of manufacture described below. As a result, during the process of transferring to the JFET and reading, the signal charge is depleted substantially completely from P-type charge accumulation layer 103, and this makes it difficult to produce a spike in potential within P-type charge accumulation layer 103. Therefore, as shown in FIG. 2, because there is no trough or spike in potential along charge transfer route KLMN, charges can be transferred completely from the BPD to the JFET and residual images are substantially eliminated.

Figure 9:
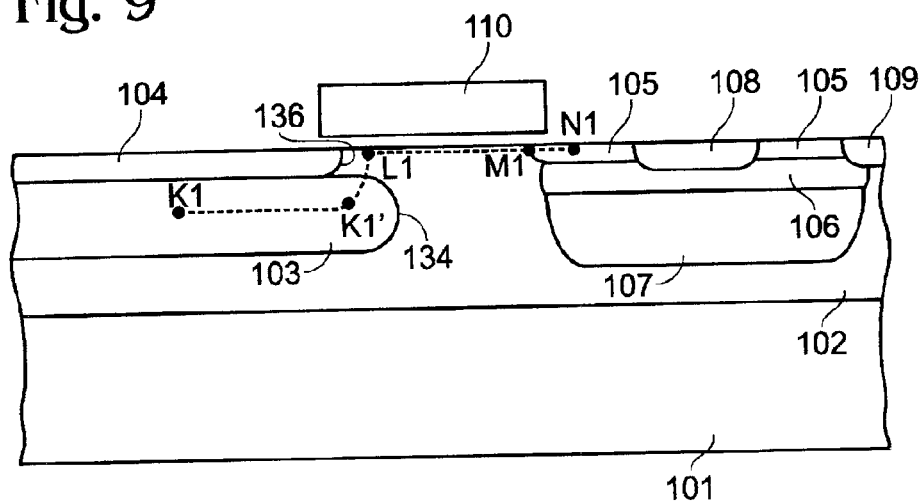
FIG. 9 shows a comparison example in which the edge of the P-type charge accumulation layer that faces the JFET is formed such that it projects substantially toward the JFET than the edge of the N-type depletion prevention layer that faces the JFET.
Figure 10:
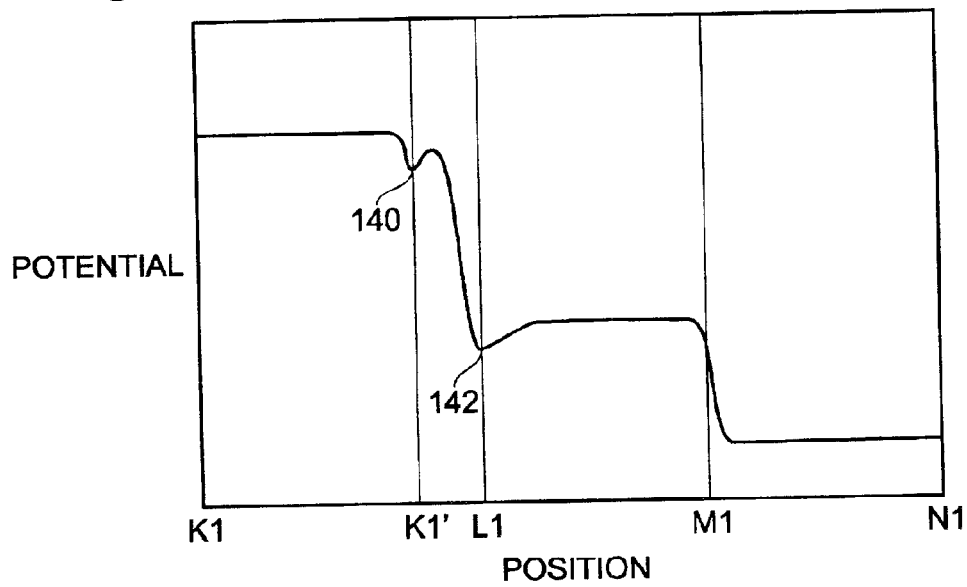
FIG. 10 is a graph of the distribution of potential along charge transfer route $K_1$, $K_{1'}$, $L_1$, $M_1$, and $N_1$ in FIG. 9 during charge transfer.

FIG. 9 shows a comparison example in which, unlike the solid picture element of this embodiment, the margin 134 of P-type charge accumulation layer 103 that faces the JFET is formed such that it projects more toward the JFET than the margin 136 of N-type depletion prevention layer 104 that faces the JFET. FIG. 10 is a graph that shows the distribution of potential along charge transfer route $K_1$, $K_{1'}$, $L_1$, $M_1$, and $N_1$ in FIG. 9 during charge transfer.

In the region where P-type charge accumulation layer 103 projects more toward the JFET than N-type depletion prevention layer 104 (near position $K_{1'}$), the lack of adequate reverse bias from N-type depletion prevention layer 104 makes depletion difficult and tends to produce a trough 140 in potential. In addition, the region on the surface of the semiconductor substrate above where P-type charge accumulation layer 103 projects more than N-type depletion prevention layer 104 (near position $L_1$) is affected by P-type charge accumulation layer 103 and tends to produce a trough 142 in potential.

Figure 11:
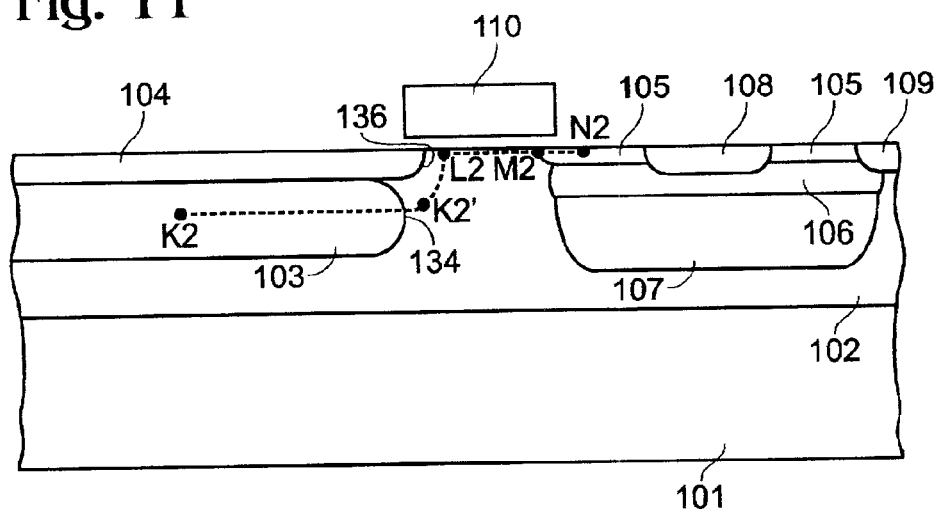
FIG. 11 shows a comparison example in which the edge of the N-type depletion prevention layer that faces the JFET is closer to the JFET than the edge of the P-type charge accumulation layer that faces the JFET.
Figure 12:
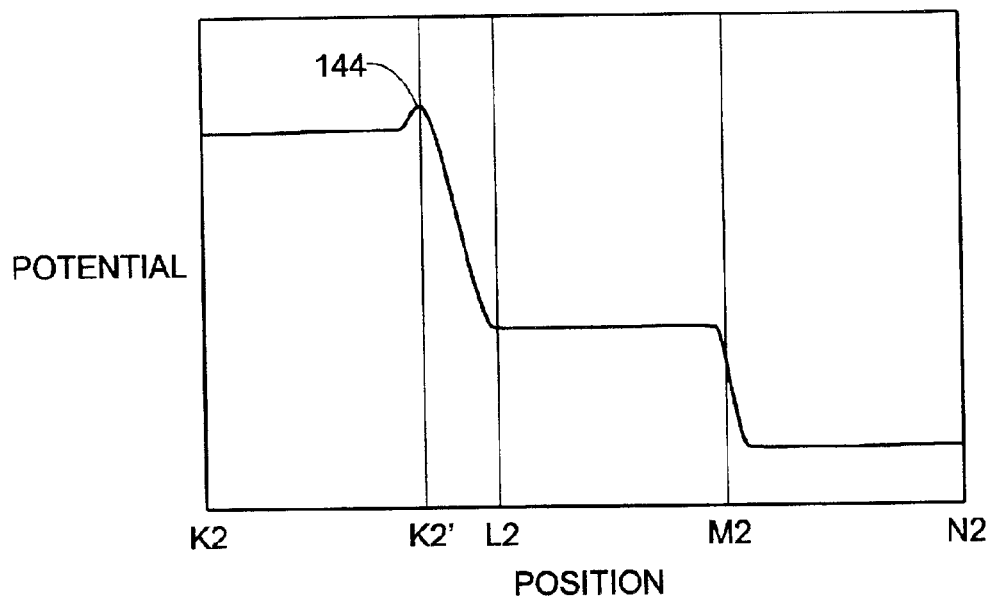
FIG. 12 is a graph that shows the distribution of potential along charge transfer route $K_2$, $K_{2'}$, $L_2$, $M_2$, and $N_2$ in FIG. 11 during charge transfer.

FIG. 11 shows a comparison example in which the margin 136 of N-type depletion prevention layer 104 that faces the JFET is closer to the JFET than the margin 134 of P-type charge accumulation layer 103 that faces the JFET. FIG. 12 is a graph that shows the distribution of potential along charge transfer route $K_2$, $K_{2'}$, $L_2$, $M_2$, and $N_2$ in FIG. 11 during charge transfer.

At the edge of transfer gate 110, a region is formed where there is no P-type charge accumulation layer 103 below N-type depletion prevention layer 104, and in this region (near position $K_{2'}$), potential increases and tends to produce a spike 144 in potential. The height of the spike in potential produced at this position $K_{2'}$ differs depending on the difference in potential between P-type charge accumulation layer 103 and JFET P-type gate 105. The smaller this difference in potential, the higher the spike, and the greater this difference in potential, the lower the spike. When the difference in potential reaches or exceeds a certain value, the spike tends to disappear.

Normally, in a solid picture element, the difference in potential between P-type charge accumulation layer 103 and N-type depletion prevention layer 104 is, for example, about 1 to 5 V. The distance that the margin 134 of P-type charge accumulation layer 103 projects toward the JFET from the margin 136 of N-type depletion prevention layer 104 was studied while considering this difference in potential, and it was found that the spike in potential (as shown in FIG. 12) disappears, and the trough in potential (as shown in FIG. 10) is adequately low when this projecting distance is from 0.0 (inline) to 0.2 µm. As a result, when the distance that P-type charge accumulation layer 103 projects from N-type depletion prevention layer 104 is 0.0 to 0.2 µm, charges can be transferred completely from the BPD to the JFET. Hence, this distance is preferred.

Figure 4:
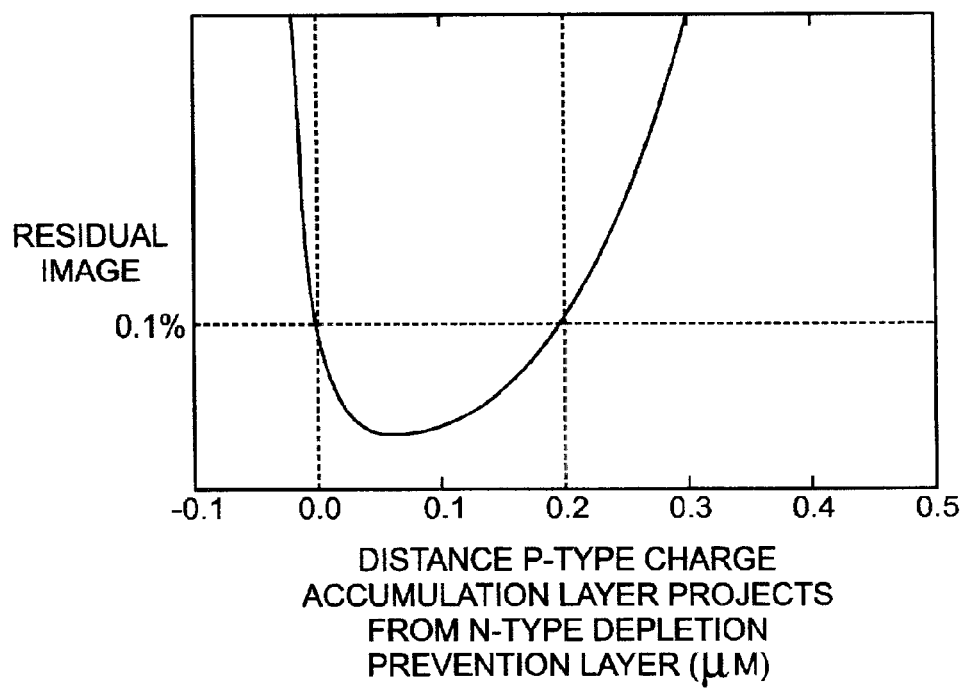
FIG. 4 is a graph of the amount of residual image when the distance that the P-type charge accumulation layer projects from the N-type depletion prevention layer toward the transistor is varied in the solid picture element of FIG. 1.

FIG. 4 is a graph that shows the amount of residual image when the distance that P-type charge accumulation layer 103 projects from N-type depletion prevention layer 104 is varied in a solid picture element of this embodiment such as shown in FIG. 1. The conditions of charge transfer operation from the P-type charge accumulation layer to the JFET are more or less the same as in the solid picture element by prior art described above. Because charges can be transferred completely from the BPD to the JFET when the distance that P-type charge accumulation layer 103 projects from N-type depletion prevention layer 104 is from 0.0 to 0.2 µm, the amount of residual image can be suppressed to the extremely low value of 0.1% or less. Because the solid picture element of this embodiment reduces the amount of residual image far below the level of the prior art solid picture element, increased product performance is realized.

Next, manufacture of the solid picture element of the present invention, particularly manufacture of the light receiving part, is explained with reference to the appended figures referenced below.

FIGS. 5a to 8c are schematic diagrams that show several methods of manufacture in which the P-type charge accumulation layer and the N-type depletion prevention layer can be formed by controlling the distance that the margin 134 of the P-type charge accumulation layer projects from the margin 136 of the N-type depletion prevention layer toward the transistor. The methods of manufacture shown in these figures are especially suitable when the distance that the P-type charge accumulation layer projects from N-type depletion prevention layer 104 is controlled within the range of 0.0 to 0.2 µm.

Figure 5A:
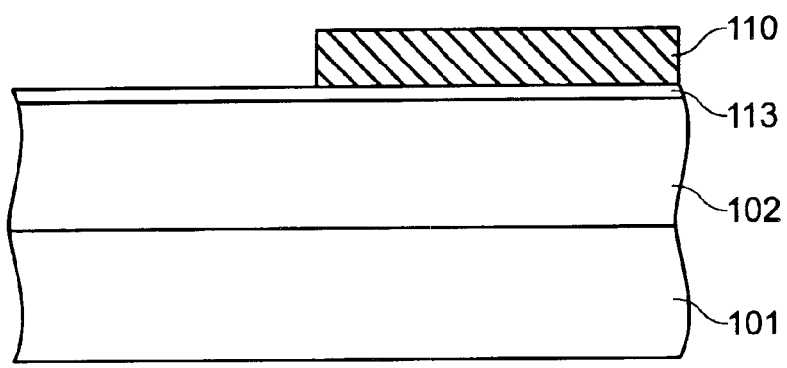
FIGS. 5a–5c are schematic diagrams that show a first preferred method for forming the P-type charge accumulation layer and the N-type depletion prevention layer in the solid picture element of FIG. 1.
Figure 5B:
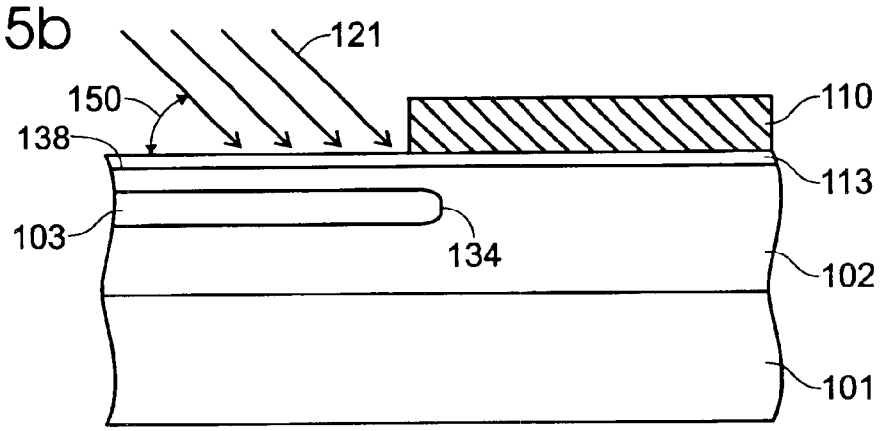
Figure 5C:
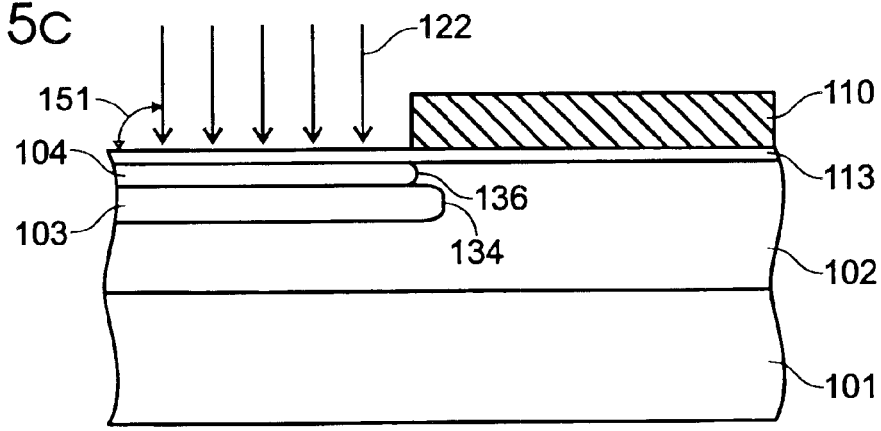

FIGS. 5a–5c are schematic diagrams that show a first preferred method for forming the P-type charge accumulation layer and the N-type depletion prevention layer by controlling the distance that the P-type charge accumulation layer projects from the N-type depletion prevention layer to a desired value.

N-type well 102 is formed within P-type semiconductor substrate 101 using standard semiconductor manufacture technology. Insulating film 113 such as gate oxide film is formed on the surface of substrate 101, and transfer gate 110, comprised of a substance such as polysilicon, is formed on insulating film 113 (FIG. 5(a)).

In this first method, P-type impurity ions 121 are implanted into N-type well 102 at an angle 150 to substrate 101 through insulating film 113 using transfer gate 110 as a mask, to form P-type charge accumulation layer 103 (FIG. 5(b)). As required, the angle 150 of implantation of P-type impurity ions 121 can be any slope angle desired, but is preferably between 30 and 80 degrees, and more preferably is between 40 and 60 degrees. In addition, by controlling the acceleration voltage of implantation, the impurity concentration of P-type charge accumulation layer 103 is adjusted such that its peak comes at a depth of about 0.3 to 1 µm, for example, from the surface of N-type well 102.

After P-type charge accumulation layer 103 is formed, N-type impurity ions 122 are implanted substantially perpendicular to the surface of substrate 101, and N-type depletion prevention layer 104 is formed within N-type well 102 in the region between P-type charge accumulation layer 103 and the surface of substrate 101; that is, the surface of N-type well 102 (FIG. 5(c)).

As required, the direction that N-type impurity ions 122 are implanted may be sloped somewhat from perpendicular to the surface of substrate 101; for example, about 7 degrees (an angle 151 of 83 degrees).

In addition, heat treatment may be performed after implanting P-type impurity ions 121 and N-type impurity ions 122. When heat treatment is performed to a degree that activates impurity ions but does not cause impurity ions to diffuse, this produces an impurity concentration at parts such as P-type charge accumulation layer 103 that is less uneven even near the edge, and this is preferred for obtaining a distribution of impurity concentration such a shown, for example, in FIG. 3.

In the first method, because P-type impurity ions 121 are implanted at a greater angle than N-type impurity ions 122, the margin 134 of P-type charge accumulation layer 103 projects from the margin 136 of N-type depletion prevention layer 104 and is closer to the JFET. P-type charge accumulation layer 103 and N-type depletion prevention layer 104 can be formed to the desired profile shape by controlling the implantation angle and acceleration voltage of P-type impurity ions 121 and N-type impurity ions 122. As a result, the distance that P-type charge accumulation layer 103 projects from N-type depletion prevention layer 104 can be precisely controlled.

FIGS. 6a–6c are schematic diagrams that show a second preferred method for forming the P-type charge accumulation layer and the N-type depletion prevention layer by controlling the distance that the P-type charge accumulation layer projects from the N-type depletion prevention layer to a desired value.

In the second method, P-type charge accumulation layer 103 is formed by implanting P-type impurity ions 121 into N-type well 102 using transfer gate 110, comprised of a substance such as polysilicon, as a mask (FIG. 6(a)). By controlling the acceleration voltage of implantation, the impurity concentration of P-type charge accumulation layer 103 is adjusted such that its peak comes at a depth of about 0.3 to 1 μm, for example, from the surface of N-type well 102.

After P-type charge accumulation layer 103 is formed, transfer gate 110 is oxidized (FIG. 6(b)). By oxidizing the surface 138 and at least an end wall 152 of transfer gate 110, oxide film 116 is formed, which also increases the volume of the transfer gate. As a result, oxide film edge 111 corresponding to the end wall of oxide film 116 is further from the transistor than was the edge of the end wall 152 of transfer gate 110. N-type impurity ions 122 are then implanted into N-type well 102 using this oxide film 116 as part of a mask, and N-type depletion prevention layer 104 is formed within N-type well 102 in the region between P-type charge accumulation layer 103 and the surface of substrate 101 (FIG. 6(c)).

As desired, the direction that N-type impurity ions 122 are implanted may be sloped somewhat from perpendicular to the surface 138 of substrate 101; for example, about 7 degrees. In addition, heat treatment may be performed after implanting P-type impurity ions 121 and N-type impurity ions 122. When heat treatment is performed to a degree that activates impurity ions but does not cause impurity ions to diffuse, this produces an impurity concentration at parts such as P-type charge accumulation layer 103 that is less uneven even near the edge, and this is preferred for obtaining a distribution of impurity concentration such a shown, for example, in FIG. 3.

In this second method, because the position of the edge of the mask (111 versus 152) differs between implantation of P-type impurity ions 121 and implantation of N-type impurity ions 122, the margin 134 of P-type charge accumulation layer 103 is formed such that it projects from the margin 136 of N-type depletion prevention layer 104. The distance that P-type charge accumulation layer 103 projects from N-type depletion prevention layer 104 can be controlled easily by adjusting the thickness of oxide film 116; that is, the amount of oxidation on transfer gate 110.

FIGS. 7a–7c are schematic diagrams that show a third preferred method for forming the P-type charge accumulation layer and the N-type depletion prevention layer by controlling the distance that the P-type charge accumulation layer projects from the N-type depletion prevention layer to a desired value.

In this third method, P-type charge accumulation layer 103 is formed by the same method as in the second method described above (FIG. 7(a)). After P-type charge accumulation layer 103 is formed, side wall insulating film 112 is formed on the side wall of transfer gate 110. Side wall insulating film 112 can be formed using the same technique as used when forming a lightly doped drain (LDD) of an MOS transistor. Side wall insulating film 112 is formed on the side wall of transfer gate 110 by depositing a PSG film or the like as an interlayer insulating film on gate oxide film 113 and transfer gate 110, then etching (FIG. 7(b)). N-type impurity ions 122 are implanted into N-type well 102 using this side wall insulating film 112 as part of a mask, and N-type depletion prevention layer 104 is formed within N-type well 102 in the region between P-type charge accumulation layer 103 and the surface of substrate 101 (FIG. 7(c)).

As required, the direction that N-type impurity ions 122 are implanted may be sloped somewhat from perpendicular to the surface of substrate 101; for example, about 7degrees. In addition, heat treatment may be performed after implanting P-type impurity ions 121 and N-type impurity ions 122. When heat treatment is performed to a degree that activates impurity ions but does not cause impurity ions to diffuse, this produces an impurity concentration at parts such as P-type charge accumulation layer 103 that is less uneven even near the edge, and this is preferred for obtaining a distribution of impurity concentration such a shown, for example, in FIG. 3.

In the third method, because the position of the edge of the mask (112 versus 152) differs between implantation of P-type impurity ions 121 and implantation of N-type impurity ions 122, the margin 134 of P-type charge accumulation layer 103 is formed such that it projects from the margin 136 of N-type depletion prevention layer 104. The distance that P-type charge accumulation layer 103 projects from N-type depletion prevention layer 104 can be controlled easily by making the width of side wall insulating film 112 more or less equal to the initial thickness of the interlayer insulating film accumulated and adjusting this width of side wall insulating film 112.

Figure 8A:
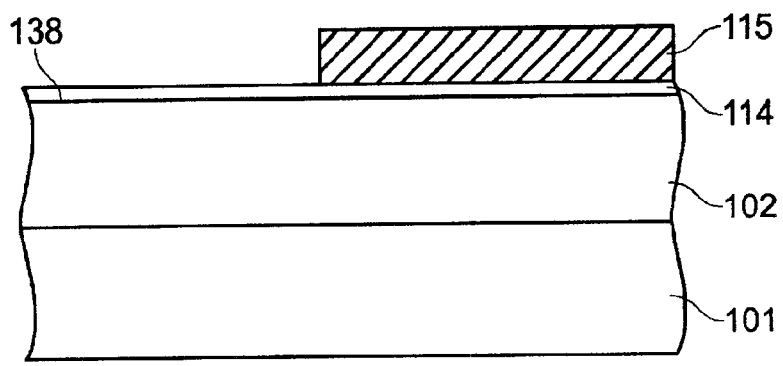
FIGS. 8a–8c are schematic diagrams that show a fourth preferred method for forming the P-type charge accumulation layer and the N-type depletion prevention layer in the solid picture element of FIG. 1.
Figure 8B:
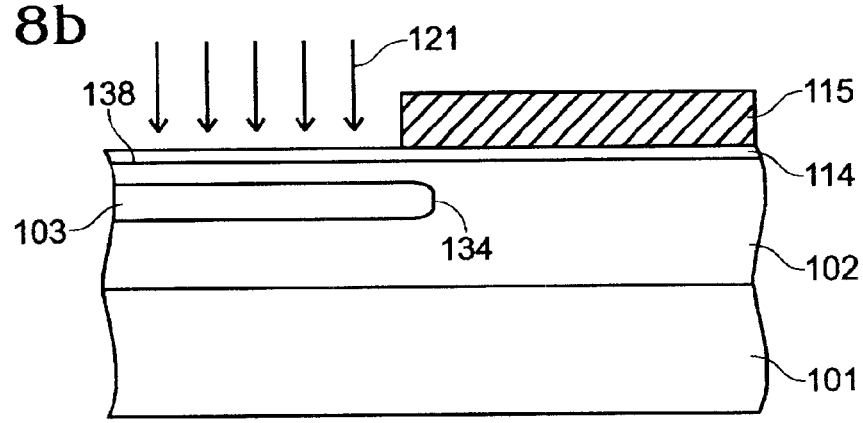
Figure 8C:
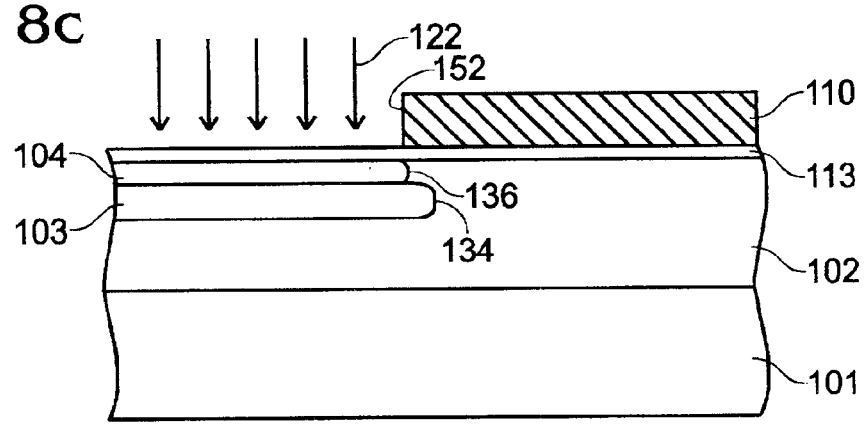

FIGS. 8a–8c are schematic diagrams that show a fourth preferred method for forming the P-type charge accumulation layer and the N-type depletion prevention layer by controlling the distance that the P-type charge accumulation layer projects from the N-type depletion prevention layer to a desired value.

In this fourth method, a resist 115 is formed by a method such as photolithography on protective oxide film 114 formed on the surface 138 of substrate 101 (that is, the surface of N-type well 102) (FIG. 8(a)). By implanting P-type impurity ions 121 into N-type well 102 using resist 115 as a mask, P-type charge accumulation layer 103 is formed within N-type well 102 (FIG. 8(b)). By controlling the acceleration voltage of implantation, the impurity concentration of P-type charge accumulation layer 103 is adjusted such that its peak comes at a depth of about 0.3 to 1 μm, for example, from the surface of N-type well 102.

After P-type charge accumulation layer 103 is formed, resist 115 is removed. Gate oxide film 113 is formed, then transfer gate 110, comprised of a substance such as polysilicon, is formed on gate oxide film 113. At this time, the position of the end wall 152 of transfer gate 110 toward P-type charge accumulation layer 103 is closer to P-type charge accumulation layer 103 than was the position of the corresponding edge of resist 115. N-type impurity ions 122 are implanted into N-type well 102 using transfer gate 110 as a mask, and N-type depletion prevention layer 104 is formed within N-type well 102 in the region between P-type charge accumulation layer 103 and the surface of substrate 101 (FIG. 8(c)).

As desired, the direction that N-type impurity ions 122 are implanted may be sloped somewhat from perpendicular to the surface of substrate 101; for example, about 7 degrees. In addition, heat treatment may be performed after implanting P-type impurity ions 121 and N-type impurity ions 122. When heat treatment is performed to a degree that activates impurity ions but does not cause impurity ions to diffuse, this produces an impurity concentration at parts such as P-type charge accumulation layer 103 that is less uneven even near the edge, and this is preferred for obtaining a distribution of impurity concentration such a shown, for example, in FIG. 3.

In this fourth method, because the position of the edge of the mask differs between implantation of P-type impurity ions 121 and implantation of N-type impurity ions 122, the margin 134 of P-type charge accumulation layer 103 is formed such that it projects from the margin 136 of N-type depletion prevention layer 104. The distance that P-type charge accumulation layer 103 projects from N-type depletion prevention layer 104 can be controlled easily by adjusting the position where resist 115 and transfer gate 110 are formed by a means such as a stepper that has good alignment precision.

Specific Embodiments

Next, the solid picture element of the present invention and its method of manufacture are explained in further detail by concrete embodiments.

First Embodiment

This embodiment pertains to the method of manufacture of a solid picture element shown in FIGS. 5a–5c.

N-type well 102 was formed within P-type semiconductor substrate 101, insulating gate oxide film 113 was formed on the surface of substrate 101, and transfer gate 110 comprised of a substance such as polysilicon was formed on insulating film 113. To form P-type charge accumulation layer 103, boron was implanted by a sloping ion implantation method at a concentration of 1 to $5 \times 10^{12}$ cm$^{-2}$ and an acceleration voltage of 50 keV to 2 MeV, then heat treatment was performed in a nitrogen atmosphere at 800 to 1000° C. for approximately 30 minutes. In some cases, heat treatment may be performed by rapid thermal acceleration.

Furthermore, to form N-type depletion prevention layer 104, phosphorus was implanted at a concentration of 1 to $5 \times 10^{13}$ cm$^{-2}$ and an acceleration voltage of approximately 80 keV, then heat treatment was performed in a nitrogen atmosphere at 800 to 950° C. for approximately 30 minutes. In some cases, heat treatment may be performed by rapid thermal acceleration.

Second Embodiment

This embodiment pertains to the method of manufacture of a solid picture element shown in FIGS. 6a–6c.

N-type well 102 was formed within P-type semiconductor substrate 101, insulating a gate oxide film 113 was formed on the surface of substrate 101, and transfer gate 110 comprised of a substance such as polysilicon was formed on insulating film 113. To form P-type charge accumulation layer 103, boron was implant at a concentration of 1 to $5 \times 10^{12}$ cm$^{-2}$ and an acceleration voltage of 50 keV to 2 MeV using transfer gate 110 as part of a mask, then heat treatment was performed in a nitrogen atmosphere at 800 to 1000° C. for approximately 30 minutes. In some cases, heat treatment may be performed by rapid thermal acceleration.

Following this, transfer gate 110 was oxidized by pyro-oxidation at 900 to 950° C. for 5 to 30 minutes, and an oxide film about 0.1 to 1 μm thick was formed. Furthermore, to form N-type depletion prevention layer 104, phosphorus was implanted at a concentration of 1 to $5 \times 10^{13}$ cm$^{-2}$ and an acceleration voltage of approximately 80 keV using the oxidized transfer gate 110 as part of a mask, then heat treatment was performed in a nitrogen atmosphere at 800 to 950° C. for approximately 30 minutes. In some cases, heat treatment may be performed by rapid thermal acceleration.

Third Embodiment

This embodiment pertains to the method of manufacture of a solid picture element shown in FIGS. 7a–7c.

N-type well 102 was formed within P-type semiconductor substrate 101, insulating gate oxide film 113 was formed on the surface of substrate 101, and transfer gate 110 comprised of a substance such as polysilicon was formed on insulating film 113. To form P-type charge accumulation layer 103, boron was implanted at a concentration of 1 to $5 \times 10^{12}$ cm$^{-2}$ and an acceleration voltage of 50 keV to 2 MeV using transfer gate 110 as part of a mask, then heat treatment was performed in a nitrogen atmosphere at 800 to 1000° C. for approximately 30 minutes. In some cases, heat treatment may be performed by rapid thermal acceleration.

Following this, side wall insulating film 112 was formed by depositing 2000 to 5000 Angstroms thick PSG film as an interlayer insulating film, then etching. Furthermore, to form N-type depletion prevention layer 104, phosphorus was implanted at a concentration of 1 to $5 \times 10^{13}$ cm$^{-2}$ and an acceleration voltage of approximately 80 keV using side wall insulating film 112 as part of a mask, then heat treatment was performed in a nitrogen atmosphere at 800 to 950° C. for approximately 30 minutes. In some cases, heat treatment may be performed by rapid thermal acceleration.

Fourth Embodiment

This embodiment pertains to the method of manufacture of a solid picture element shown in FIGS. 8a–8c.

N-type well 102 was formed within P-type semiconductor substrate 101, protective oxide film 114 was formed on the surface of substrate 101, and resist mask 115 was formed on top of protective oxide film 114. To form P-type charge accumulation layer 103, boron was implanted at a concentration of 1 to $5 \times 10^{12}$ cm$^{-2}$ and an acceleration voltage of 50 keV to 2 MeV using transfer gate 110 as part of a mask, then heat treatment was performed in a nitrogen atmosphere at 800 to 1000° C. for approximately 30 minutes. In some cases, heat treatment may be performed by rapid thermal acceleration.

Following this, resist mask 115 was removed and insulating gate oxide film 113 was formed, then transfer gate 110 was formed. Furthermore, to form N-type depletion prevention layer 104, phosphorus was implanted at a concentration of 1 to $5 \times 10^{13}$ cm$^{-2}$ and an acceleration voltage of approximately 80 keV using transfer gate 110 as part of a mask, then heat treatment was performed in a nitrogen atmosphere at 800 to 950° C. for approximately 30 minutes. In some cases, heat treatment may be performed by rapid thermal acceleration.

Embodiments also can be constructed by reversing P-type and N-type. In addition, the element region may be formed within the well region, or may be formed directly on the semiconductor substrate without forming a well region. The transistor for amplifying charges is not limited to a JFET, but also can be a bipolar transistor or MOS transistor. Preferably, transfer gate is a MOS gate.

As explained above, the solid picture element of this invention can eliminate spikes or troughs in potential along the charge transfer route during transfer of charges from the charge accumulation layer of a photodiode to an amplifying transistor. As a result, charges can be transferred more or less completely from the photodiode to the amplifying transistor, and residual images can be substantially eliminated.

In addition, according to the methods of manufacture of a solid picture element by this invention, because the charge accumulation layer and the depletion prevention layer of a photodiode can be controlled to the desired profile, a solid picture element that can transfer charges completely from the photodiode to the amplifying transistor and substantially eliminate residual images can be manufactured easily and accurately.

What is claimed is:

1. A method of manufacturing a solid picture element having a semiconductor substrate of a first conductive type with a first surface, a transistor located within the semiconductor substrate for amplifying charges, a charge accumulation region of a second conductive type located within the semiconductor substrate, the charge accumulation region having a margin located a first distance from the transistor, a depletion prevention region of the first conductive type located between the charge accumulation region and the first surface of the semiconductor substrate, the depletion prevention region having a margin located a second distance from the transistor, and a transfer gate located on the first surface of the semiconductor substrate between the depletion prevention region and the translator overlapping a portion of the depletion prevention region margin and the charge accumulation region margin, the charge accumulation region margin being closer to the transistor than the depletion prevention margin, the transfer gate controlling transfer of charges from the charge accumulation region to the transistor, the substrate and the depletion prevention region have different impurity concentrations, the method comprising the steps:

implanting ions of the first conductive type at a first angle to the first surface of the semiconductor substrate using the transfer gate as a mask and forming the charge accumulation region such that it is within the semiconductor substrate and doesn't contact the first surface of the semiconductor substrate; and implanting ions of the second conductive type at a second angle to the first surface of the semiconductor substrate using the transfer gate as a mask and forming the depletion prevention region such that it is between the charge accumulation region and the first surface of the semiconductor substrate;

wherein the first angle is not greater than the second angle, thereby causing the first distance of the charge accumulation region margin to the transistor to be no greater than the second distance of depletion prevention region margin to the transistor.

2. The method of claim 1 wherein the first angle is between 30 degrees and 80 degrees and the second angle is substantially 90 degrees.

3. The method of claim 1 wherein the first angle is between 40 degrees and 60 degrees and the second angle is substantially 90 degrees.

4. The method of claim 1 wherein the first angle is between 30 degrees and 80 degrees and the second angle is between 80 degrees and 90 degrees.

5. The method of claim 1 wherein the first angle and the second angle are substantially equal and the charge accumulation region margin and the depletion prevention region margin are substantially the same distance from the transistor.

6. The method of claim 1 wherein the second distance of the depletion region margin to the transistor is between 0.0 μm and 0.2 μm greater than the first distance of the charge accumulation region margin to the transistor.

7. The method of claim 1 wherein the depth of the charge accumulation region from the first surface is between 0.6 μm and 0.8 μm and the maximum impurity concentrations of the charge accumulation region is between $1\times10^{17}$ and $2\times10^{17}$ per $cm^3$, and the first angle is between 66 degrees and 75 degrees and the second angle is between 80 degrees and 90 degrees.

* * * * *